United States Patent [19]

Eastmond

[11] Patent Number: 5,036,540
[45] Date of Patent: Jul. 30, 1991

[54] SPEECH OPERATED NOISE ATTENUATION DEVICE

[75] Inventor: Bruce C. Eastmond, Downers Grove, Ill.

[73] Assignee: Motorola, Inc., Schaumburg, Ill.

[21] Appl. No.: 413,910

[22] Filed: Sep. 28, 1989

[51] Int. Cl.⁵ .................................. H04B 15/00
[52] U.S. Cl. ............................ 381/47; 381/71; 381/94
[58] Field of Search .......................... 381/41–47, 381/71, 94; 364/513.5

[56] References Cited

U.S. PATENT DOCUMENTS

| | | | |
|---|---|---|---|
| 4,630,304 | 12/1986 | Borth et al. | 381/47 |
| 4,747,143 | 5/1988 | Kroeger et al. | 381/47 |
| 4,759,071 | 7/1988 | Heide | 381/47 |
| 4,811,404 | 3/1989 | Vilmur et al. | 381/47 |
| 4,918,734 | 4/1990 | Muramatsu et al. | 381/46 |

Primary Examiner—Gary V. Harkcom
Attorney, Agent, or Firm—Joseph P. Krause

[57] ABSTRACT

A speech operated noise attenuation device (SONAD) includes circuitry to measure the noise level in an audio channel. The output of the noise measurement circuitry provides a control signal to an audio attenuator which varies the intersyllable attenuation of the background noise according to the noise level present in the audio.

5 Claims, 1 Drawing Sheet

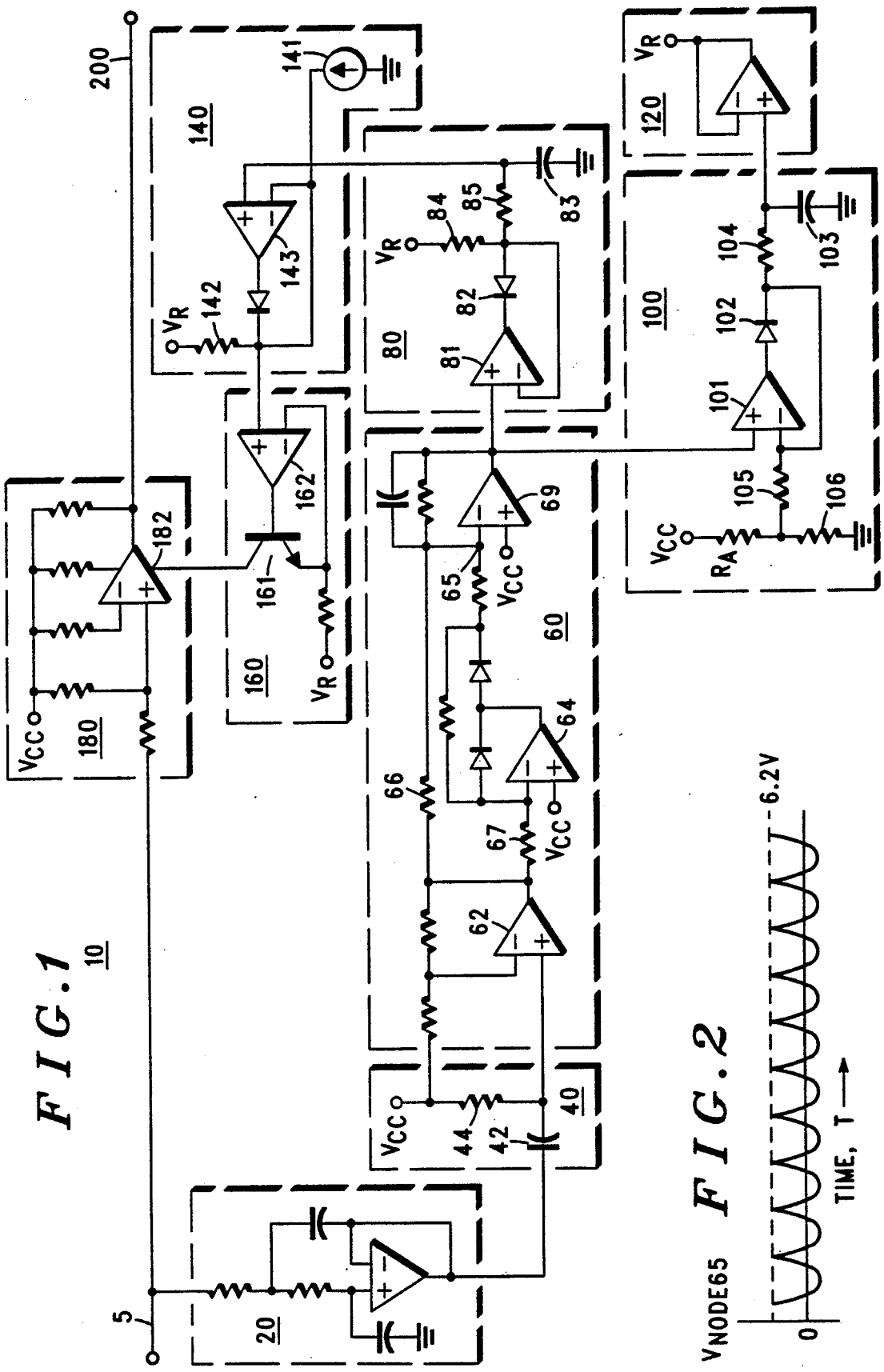

SPEECH OPERATED NOISE ATTENUATION DEVICE

BACKGROUND OF THE INVENTION

This invention relates to audio noise reduction circuits. In particular, this invention relates to speech operated noise attenuation circuits that attenuate intersyllabic background (noise between syllables) in audio circuits such as those found in the audio output stage of a radio receiver.

Prior art speech operated noise attenuation device (SONAD) attenuate an audio signal in the absence of a voice or speech signals to suppress the apparent level of background noise between syllables. These prior art circuits typically provide a degree of intersyllabic noise attenuation which is related to the prevailing noise level in the signal. When background noise levels vary, the noise suppression provided by these prior art circuits varies as well. In many audio signals the level of background noise varies over a wide range so that the effectiveness of the prior art SONAD in removing intersyllabic noise will vary significantly. A SONAD that reduces background noise while accommodating changes in the background noise level would be an improvement over the prior art.

SUMMARY OF THE INVENTION

There is provided herein a SONAD which follows variations in the input noise level of an audio signal that exist in a circuit such as a radio receiver. In one embodiment of the invention, the SONAD uses a current controlled attenuator circuit which is driven by circuitry including a signal peak detector and a valley detector in order to provide a continuously varying control signal to the attenuation circuit that is dependent upon the background noise level present in the channel. The signal valley detector circuit identifies the noise level floor and provides an attenuator control voltage which is proportional to the noise. The valley detector has a relatively fast attack time and slow decay time in order to permit changes in the background noise level to be dynamically tracked.

In the preferred embodiment, the valley detector controls the attenuator by providing a reference voltage to a voltage comparator or clipper, which changes with the background noise level. The voltage comparator drives a current to voltage converter which in turn controls a current controlled attenuator. The valley detector provides control over the attenuator in such a way that the attenuation provided by the attenuator changes according to the background noise floor.

Other circuit functions in the invention include a syllabic envelope detector which provides a relatively slowly varying signal that is substantially the voice envelope present on the channel. The valley detector identifies the average noise signal present in the output of the syllabic envelope detector. A low pass filter together with a pre-emphasis circuit conditions the audio input signal so as to ensure that all speech sounds are readily detected.

A peak detector samples the output of the syllabic envelope detector to provide a signal indicative of the maximum signal excursion present in the audio signal. The output of the peak detector is compared by a voltage clipper or comparator, to identify the maximum signal excursion permitted by SONAD. A voltage to current converter samples the output of the voltage clipper to provide a control signal to a current controlled attenuator.

Virtually all the functional blocks of the preferred embodiment are implemented using conventional operational amplifiers and resistive and capacitive components.

DESCRIPTION OF THE DRAWINGS

FIG. 1 shows a simplified schematic drawing of SONAD of the preferred embodiment.

FIG. 2 shows a plot of a voltage output from a syllabic envelope detector.

DETAILED DESCRIPTION OF THE PREFERRED EMBODIMENT

FIG. 1 shows a schematic diagram of the SONAD that tracks or adjusts to changes in the background noise level of an audio signal in an audio circuit such as radio receiver communication device. In a radio receiver, the audio signal processed by the circuit of FIG. 1 would typically be the audio after demodulation.

An audio signal is input to a low pass filter section (20) in parallel with its connection to a current controlled attenuator (180). In the preferred embodiment the low pass filter (20) is an active filter having a 3 db cutoff frequency at approximately 2.75 kilohertz. This bandwidth accommodates speech communication signals whereas wider bandwidths for different applications could be provided as well.

The low pass filter (20) is coupled to a pre-emphasis circuit (40) which equalizes the amplitude of low and high-frequency signal components. In the embodiment shown the pre-emphasis circuit (40) is comprised of capacitor 42 and resistor 44.

The output of the pre-emphasis circuit (40) is then input to a syllabic envelope detector (60). The syllabic envelope detector (60) is comprised of three operational amplifier stages. A first voltage amplifier stage (62) provides a non-inverted amplification of the output of the pre-emphasis (40) of approximately 3 to 1. The non-inverted voltage amplification by the first amplifier (62) is split into two components, one of which passes to a half-wave rectifier stage (64), the other component passes through a resistor (66) as shown. In the preferred embodiment this resistor (66) was twice the value of resistor 67 providing a combined signal at node 65 which is substantially a full-wave rectified version of the signal input to the syllabic envelope detector (60) having a negative polarity and referenced to 6.2 volts. The wave form at node 65 is shown in FIG. 2.

The output of the syllabic envelope detector is coupled to two voltage detector circuits. A peak detector (80) is comprised of an operational amplifier configured for unity gain (81), a diode (82) oriented to generate a unipolar charging voltage, and a reference capacitor (83). The peak detector circuit (80) has a relatively fast attack or charging time for charging capacitor (83) and a relatively long discharging time. The peak detector charges the capacitor (83) to the maximum negative excursion of the output of the syllabic envelope detector (60). As the signal input to the peak detector (80) becomes increasingly more negative the output of the amplifier (81) will also go increasingly negative, pulling down the voltage across the reference capacitor (83). On the other hand, when signal excursions from the syllabic envelope detector are less negative than the voltage established across capacitor 83, capacitor 83 will dicharge through the series connected resistors (84 and 85) as shown.

The output of the syllabic envelope detector is also connected to a valley detector circuit (100). This circuit detects the average noise level present on the signal output from the syllabic envelope detector (60) as follows. The valley detector has a fast attack time and a relatively long decay time. As the orientation of the diode (102) is reversed with respect to that of diode 82 the positive signal excursions of the output from the syllabic envelope detector (62), which are greater than a voltage $$V_{r1} = V_{cc}\left(\frac{R_{106}}{R_A + R_{106}}\right)$$

(where $V_{cc}$ is the power supply voltage) are impressed upon the capacitor (103). (The output of the syllabic envelope detector is negative. References to the most positive value of the output of the envelope detector means values less negative, which are indicative of background noise.) As the signal from the syllabic envelope detector (60) goes increasingly positive (i.e., less negative) the amplifier (101) charges the filter capacitor (103) through the diode (102). When the signal from the syllabic envelope detector (60) goes negative, diode 102 prevents the amplifier (101) from discharging the capacitor (103), permitting the discharge of capacitor 103 to occur solely through resistors 104, 105 and 106 as shown. The syllabic envelope detector output to the valley detector produces a reference voltage which indicates the most positive (least negative) signal that is present on the audio channel which corresponds to the noise signal level present on the channel. The output of the valley detector is buffered by another amplifier stage (120) to produce a reference voltage $V_r$ as shown. $V_r$ will change with changes in the backgrouond noise level on the channel when the syllabic envelope detector output is greater than $V_{r1}$.

The reference voltage of $V_r$ generated by the valley detector (100) is used to permit the current control attenuator (180) to continuously adjust its attenuation based upon the noise signal floor present in the signal. The current controlled attenuator (180) adjusts the attenuation of the audio signal input at terminal 5 according to the current through the attenuation control input 182 by a voltage to current converter (160) coupled to $V_r$. The voltage to current converter (160) utilizes a reference voltage from the emitter of transistor (161) to establish the current output. Transistor 161 is controlled by the inputs to op-amp (162) received from voltage clipper 140. A reference resistor (142) and constant current source (141) defined a threshold voltage above which the voltage at the input to op-amp 162 follows the voltage across capacitor 83.

When the voltage across the filter capacitor (83) exceeds the voltage drop across the reference resistor (142), the output of operational amplifier 143 will follow the voltage on capacitor 83, thereby reducing the current through transistor 161 and lowering the gain of the current-controlled attenuator 180.

Using the circuit described above, intersyllabic noise control in the audio signal output at 200 of the SONAD (10) can be substantially improved over prior art SONAD devices which do not continuously adjust for varying background noise level.

What is claimed is:

1. A speech operated noise attenuation device for reducing background noise in audio signals input to said speech operated noise attenuation device, said speech operated noise attenuation device receiving only unprocessed speech signals from a radio receiver demodulator, said speech operated noise attenuation device comprising:

a current controlled attenuator receiving audio signals, having a control input, that varies the attenuation of audio signals input to said current controlled attenuator in response to a control signal input to said current controlled attenuator through said control input;

signal processing means, receiving said un-processed audio signals, for dynamically identifying a level of background noise in said un-processed audio signals and for providing a first dynamically varying control signal to said control input of said current controlled attenuator to adjust attenuation of said un-processed audio signals according to changes in the level of said background noise, said signal processing means comprised of:

a signal valley detector means for detecting the average minimum background noise signal present in said audio signals, said average minimum background noise signals being identified as the background noise signal level floor, said background noise level floor representing the average minimum background noise signal present in said audio signal and for providing a background noise level reference signal representative of the average minimum background noise level in said audio signal;

control circuit means responsive to said background noise level reference signal from said signal valley detector means for generating a second control signal, said second control signal being coupled to said control input of said current controlled attenuator to control attenuation of said audio signal by said current controlled attenuator.

2. The speech operated noise attenuation device of claim 1 where said control signal from said control circuit means includes a voltage.

3. The speech operated noise attenuation device of claim 1 where said control circuit means responsive to said background noise level reference signal includes voltage comparator means for generating a control signal, said voltage comparator means generating said second signal substantially proportional to the background noise level when said background noise level reference signal falls below a first threshold value.

4. The speech operated noise attenuation device of claim 1 further comprising:

syllabic envelope detector means detecting amplitude excursions of an audio signal;

signal detector means coupled to said syllabic envelope detector means for detecting the presence of voice activity in said audio signal;

voltage threshold detectors coupled to said signal peak detector means for producing third control signals to control said attenuation control means at predetermined audio signal levels input to said speech operated noise attenuation device, said voltage threshold detectors controlling said attenuation control means to attenuate audio signal levels based on audio signal level changes.

5. The speech operated noise attenuation device of claim 4 where said current controlled attenuator means produces control signals to said attenuation control means to decrease the output audio signal level when voice signals are absent.

* * * * *

UNITED STATES PATENT AND TRADEMARK OFFICE
CERTIFICATE OF CORRECTION

PATENT NO. : 5,036,540

DATED : JULY 30, 1991

INVENTOR(S) : BRUCE C. EASTMOND

It is certified that error appears in the above-identified patent and that said Letters Patent is hereby corrected as shown below:

In Col. 4, line 46, please insert the word —control— between the words "second" and "signal".

Signed and Sealed this

Twenty-second Day of December, 1992

*Attest:*

DOUGLAS B. COMER

*Attesting Officer*     *Acting Commissioner of Patents and Trademarks*